US012264266B2

United States Patent
Ren et al.

(10) Patent No.: US 12,264,266 B2
(45) Date of Patent: Apr. 1, 2025

(54) CHEMICAL MECHANICAL POLISHING LIQUID

(71) Applicant: ANJI MICROELECTRONICS TECHNOLOGY (SHANGHAI) CO., LTD, Shanghai (CN)

(72) Inventors: Xiaoming Ren, Shanghai (CN); Changzheng Jia, Shanghai (CN); Shoutian Li, Shanghai (CN)

(73) Assignee: ANJI MICROELECTRONICS TECHNOLOGY (SHANGHAI) CO., LTD., Shanghai (CN)

( * ) Notice: Subject to any disclaimer, the term of this patent is extended or adjusted under 35 U.S.C. 154(b) by 370 days.

(21) Appl. No.: 17/785,000

(22) PCT Filed: Dec. 3, 2020

(86) PCT No.: PCT/CN2020/133613
§ 371 (c)(1),
(2) Date: Jun. 13, 2022

(87) PCT Pub. No.: WO2021/121049
PCT Pub. Date: Jun. 24, 2021

(65) Prior Publication Data
US 2023/0032899 A1    Feb. 2, 2023

(30) Foreign Application Priority Data
Dec. 19, 2019    (CN) .......................... 201911320538.X

(51) Int. Cl.
*C09G 1/02*    (2006.01)

(52) U.S. Cl.
CPC ..................... *C09G 1/02* (2013.01)

(58) Field of Classification Search
None
See application file for complete search history.

(56) References Cited

U.S. PATENT DOCUMENTS

| 2013/0244433 A1 | 9/2013 | Reiss et al. |
| 2021/0115302 A1* | 4/2021 | Johnson ............... C01F 17/241 |

FOREIGN PATENT DOCUMENTS

| CN | 101142659 A | 3/2008 |
| CN | 101517709 A | 8/2009 |
| CN | 104650740 A | 5/2015 |
| CN | 109500721 A | 3/2019 |
| WO | 2007127121 A1 | 11/2007 |

OTHER PUBLICATIONS

Office Action for CN Appl. No. 20191320538X with English translation, issued May 20, 2023, 7 pages.
Notification of Reexamination for CN Appl. No. 20191320538X with English translation, issued Jun. 26, 2024, 9 pages.

* cited by examiner

*Primary Examiner* — Roberts P Culbert
(74) *Attorney, Agent, or Firm* — Dentons US LLP

(57) ABSTRACT

Disclosed is a chemical mechanical polishing solution containing water, cerium oxide, polyacrylic acid and polyether amine. The chemical mechanical polishing solution in this application uses polyether amine as an additive, which can improve the polishing rate of silicon dioxide by negatively charged cerium oxide.

7 Claims, 1 Drawing Sheet

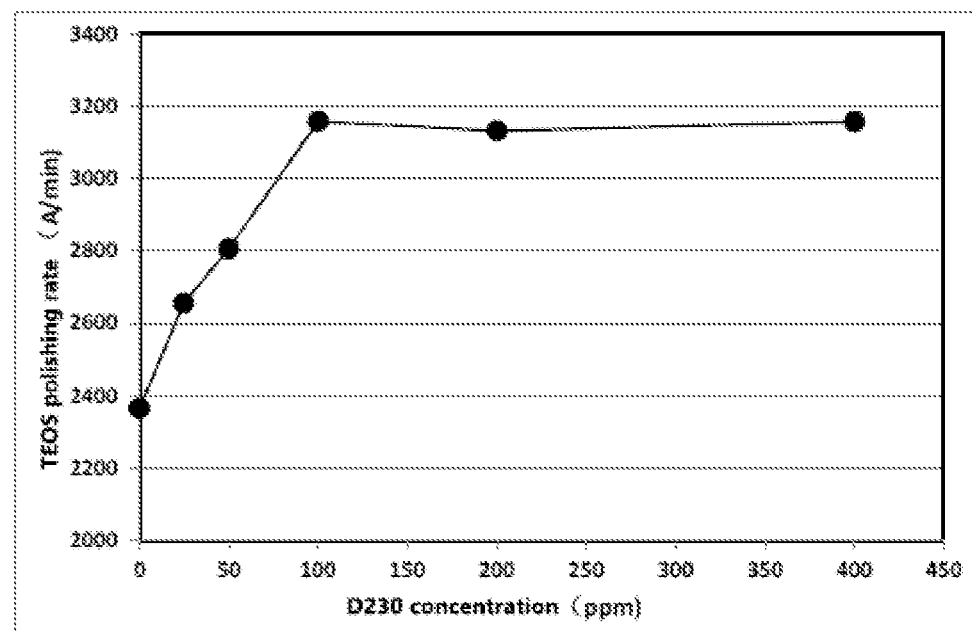

CHEMICAL MECHANICAL POLISHING LIQUID

CROSS-REFERENCE TO PRIOR APPLICATIONS

This application is a National Stage of PCT/CN2020/133613, filed Dec. 3, 2020 and published on Jun. 24, 2021 as WO 2021/121049 A1, which claims priority to Chinese Patent Application No. 201911320538.X, filed Dec. 19, 2019, each hereby expressly incorporated by reference in its entirety.

TECHNICAL FIELD

The present invention relates to a chemical mechanical polishing solution.

BACKGROUND

Currently, chemical mechanical polishing (CMP) has become the most effective and mature planarization technology in the process of manufacturing micro-nano devices. In the process of manufacturing micro-nano devices, the process of shallow trench isolation (STI) has become the mainstream isolation technology in recent years because of its outstanding performance of isolation, flat morphology and good locking performance.

In the polishing process of shallow trench isolation, polyacrylic acid anionic polymer is often used as a dispersant for cerium oxide abrasive particles. When the pH value is greater than 4, it can make the surface of cerium oxide negatively charged, resulting in a high silicon dioxide/silicon nitride selection ratio. Polyacrylic acid anionic polymer as an additive also has a high silicon dioxide/silicon nitride selection ratio. However, in the application process, the addition of polyacrylic acid anionic polymer will reduce the polishing rate of silicon dioxide.

DESCRIPTION

To solve the problem that polyacrylic acid in the chemical mechanical polishing solution can reduce the polishing rate of silicon dioxide existing in the prior art, this invention provides a chemical mechanical polishing solution, which includes cerium oxide, polyacrylic acid, polyether amine and water, with the molecular weight of polyether amine of 230-4,000, preferably polyether amine D230 (molecular weight 230, refer to structure 1, x=3), polyether amine D400 (molecular weight 400, refer to structure 1, x=6), polyether amine D2000 (molecular weight 2,000) and polyether amine D4000 (molecular weight 4,000), and more preferably, the molecular weight of polyether amine of 230 or 400. Using polyether amine D as an additive, the chemical mechanical polishing solution in this application can improve the polishing rate of silicon dioxide by negatively charged cerium oxide.

Structure 1. Structure of Polyether Amine D Series

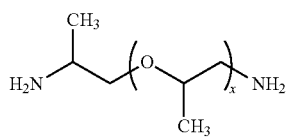

Further, the content of the polyether amine is 1-400 ppm. The polishing rate becomes saturated when the content of polyether amine is 100 ppm. In other words, when the content of the polyether amine is more than or equal to 100 ppm, the polishing rate remains unchanged.

Further, that molecular weight of the polyether amine is 230-4,000 (preferably x of 3-68 in Structure 1), preferably 230-400 (preferably x of 3-6 in Structure 1).

Further, the content of the cerium oxide is 0.1 wt %-1.5 wt %.

Further, the content of the polyacrylic acid is 400-1,500 ppm, preferably 530 ppm.

Further, the molecular weight of the polyacrylic acid is 4,500-5,000.

Further, the pH ranges from 4 to 8. When it is less than 4, the particle size of cerium oxide becomes larger; when it is greater than 8, the chemical mechanical polishing effect by shallow trench isolation is unsatisfactory.

Further, the chemical mechanical polishing solution further includes a pH regulator, which is ammonia water, potassium hydroxide or nitric acid, acetic acid, hydrochloric acid and sulfuric acid.

The reagents and raw materials used in the present invention are commercially available. In the present invention, ppm refers to the mass concentration expressed with the parts per million of solute mass to total solution mass, which is called ppm concentration. The wt % and the percentage of each component are mass percentage concentrations.

Compared with the prior art, the invention has the advantages that by adding polyether amine D, the chemical mechanical polishing solution can keep a high silicon dioxide/silicon nitride selection ratio, and at the same time, improve the polishing rate of silicon dioxide by negatively charged cerium oxide.

DESCRIPTION OF THE DRAWING

The FIGURE shows the influence of the content of polyether amine D230 on the polishing rate of silicon dioxide.

EMBODIMENTS

The advantages of an embodiment of the invention will be explained in detail with reference to the following drawing and embodiments.

Embodiment 1

Preparation method: In this embodiment, comparative embodiment 1A is 0.4 wt % cerium oxide, and comparative embodiment 1B is 530 ppm polyacrylic acid with molecular weight of 4,500-5,000 added to the comparative embodiment 1A (to make the cerium oxide negatively charged), with pH value being adjusted to 5 by adding ammonia water (NH$_4$OH) or nitric acid (HNO$_3$), and mass percentage being complemented to 100% with water. Refer to Table 1 for details of components.

Polishing method: The polishing machine Mirra is used to polish TEOS blanks. The corresponding polishing conditions include: IC1010 polishing pad, polishing disk (Platten) and polishing head (Carrier) with rotating speed set at 93 rpm and 87 rpm respectively, pressure set at 4 psi, and flow rate of polishing solution set at 150 mL/min. The thickness of the TEOS film is measured by using NanoSpec nonmetal film thickness measuring instrument (NanoSpec6100-300).

The thickness of the blanks is obtained by measuring 49 points on the diameter line with equal intervals, starting from 3 mm away from the edge of the wafer. The polishing rate is the average value of these 49 points. Refer to Table 1 for polishing rate results of TEOS blanks in each polishing solution.

TABLE 1

Comparison of Polishing Rate of Cerium Oxide before and after Polyacrylic Acid Treatment

| Polishing solution | Treated with polyacrylic acid or not | pH | Zeta potential 1 | Polishing rate of silicon dioxide (Å/min) |
|---|---|---|---|---|
| 1A (comparative embodiment) | No | 5 | 35 mV | 4,105 |
| 1B (comparative embodiment) | Yes | 5 | −35 mV | 2,364 |

Table 1 shows that the Zeta potential of cerium oxide treated with polyacrylic acid changes from +35 mV to −35 mV, indicating that the surface of cerium oxide is coated with polyacrylic acid. The cerium oxide is reduced substantially in polishing rate after being treated with polyacrylic acid.

Embodiment 2

In this embodiment, reference embodiment is 0.4 wt % cerium oxide and the acrylic acid content is 530 ppm. In other embodiments and comparative embodiments, polyether amine D230 with different contents is added to the reference embodiment, with pH value being adjusted to 5 by adding ammonia water (NH4OH) or nitric acid (HNO3), and mass percentage being complemented to 100% with water. Refer to Table 2 for details of components. Polishing method: The polishing machine Mirra is used to polish TEOS blanks. The corresponding polishing conditions include: IC1010 polishing pad, polishing disk (Platten) and polishing head (Carrier) with rotating speed being set at 93 rpm and 87 rpm respectively, pressure set at 4 psi, and flow rate of polishing solution set at 150 mL/min. The thickness of the TEOS films is measured by using NanoSpec nonmetal film thickness measuring instrument (NanoSpec6100-300). The thickness of the blanks is obtained by measuring 49 points on the diameter line with equal intervals, starting from 3 mm away from the edge of the wafer. The polishing rate is the average value at these 49 points. Refer to table 2 for polishing rate results of TEOS blanks in each polishing solution.

TABLE 2

Effect of D230 Addition Amount on Polishing Rate of Polyacrylic-Acid-Treated CeO2

| Polishing solution | Polyether amine | Concentration (ppm) | Polishing rate of silicon dioxide (Å/min) @ 4 psi | Increase |
|---|---|---|---|---|
| 2A (comparative embodiment) | No | 0 | 2,364 | 0% |
| 2B (embodiment) | D230 | 25 | 2,656 | 12% |
| 2C (embodiment) | D230 | 50 | 2,806 | 19% |
| 2D (embodiment) | D230 | 100 | 3,158 | 34% |
| 2E (embodiment) | D230 | 200 | 3,132 | 32% |
| 2F (embodiment) | D230 | 400 | 3,157 | 34% |

Table 2 shows that polyether amine D230 can significantly improve the polishing rate of silicon dioxide in chemical mechanical polishing solution containing polyacrylic-acid-treated cerium oxide. That is, the present application overcomes the technical problem existing in the prior art: the addition of polyacrylic acid anionic polymer can reduce the polishing rate of silicon dioxide), with a maximum increase of 34 wt %. As the content of compound polyether amine D230 increases, it is found that polyether amine does not increase any longer in polishing rate when it reaches 100 ppm. In other words, the polyether D230 becomes saturated in polishing rate when it is 100 ppm in concentration. The influence of the content of polyether amine D230 on the polishing rate of silicon dioxide is shown in Table 2 and FIG. 1.

Embodiment 3

In this embodiment, reference embodiment is 0.4 wt % cerium oxide and the acrylic acid content is 900 ppm. In other embodiments and comparative embodiments, different kinds of polyether amine series compounds are added other than polyether amine D230 and polyether amine D400 (refer to Structure 1) to the reference embodiment, with pH value being adjusted to 5 by adding ammonia water (NH4OH) or nitric acid (HNO3), and mass percentage being complemented to 100% with water. Refer to examples in polyether amine ED series (refer to Structure 2) and polyether amine T series (refer to Structure 3), and polyether amine M series (refer to Structure 4). For example, polyether amine T403 (x=1-2, y=1-2, z=1-2), polyether amine M600 (x=1-2, y=9-11), and polyether amine ED900 (x=1-5, y=12.5, z=1-5), polyether amine ED2003 (x=1-5, y=39, z=1-5), polyether amine ED2100 (x=1-5, y=41, z=1-5), and polyether amine ED2003 (y=39, x=1-5, z=1).

Polishing method: The polishing machine Mirra is used to polish TEOS blanks. The corresponding polishing conditions include: IC1010 polishing pad, polishing disk (Platten) and polishing head (Carrier) with rotating speed set at 93 rpm and 87 rpm respectively, pressure set at 4 psi, and flow rate of polishing solution set at 150 mL/min. The thickness of TEOS films is measured by using NanoSpec nonmetal film thickness measuring instrument (NanoSpec6100-300). The thickness of blanks is obtained by measuring 49 points on the diameter line with equal intervals, starting from 3 mm away from the edge of the wafer. The polishing rate is the average value of these 49 points. Refer to Table 3 for polishing rate results of TEOS blanks in each polishing solution.

Structure 2. Structure of Polyether Amine ED Series

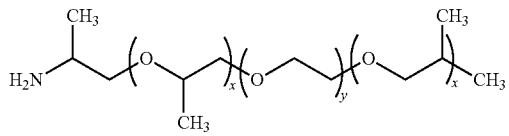

Structure 3. Structure of Polyether Amine T Series

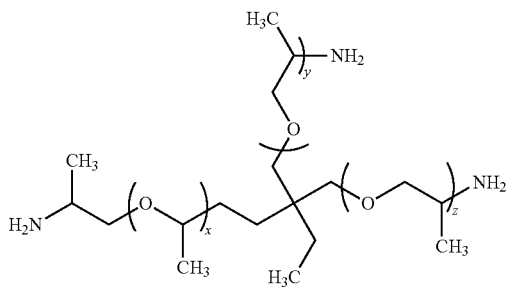

Structure 4. Structure of Polyether Amine M Series

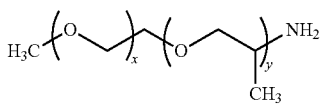

TABLE 3

Effects of Other Polyether Amine Compounds on Polishing Rate of Polyacrylic Acid-treated Cerium Oxide

| Polishing solution | Polyether amine series compounds | Concentration (ppm) | Polishing rate of silicon dioxide (Å/min) @ 4 psi | Change |
|---|---|---|---|---|
| 3A (comparative embodiment) | No | 0 | 2,395 | 0% |
| 3B (embodiment) | T403 | 50 | 2,062 | −14% |
| 3C (embodiment) | ED2003 | 50 | 1,746 | −27% |
| 3D (embodiment) | ED600 | 50 | 2,037 | −15% |
| 3E (embodiment) | ED900 | 50 | 1,902 | −21% |
| 3F (embodiment) | M600 | 50 | 1,793 | −25% |

Table 3 shows that, polyether amine series compounds (such as T series, ED series and M series) other than polyether amine D series (such as polyether amine D230 and polyether amine D400) have not improved the polishing rate of silicon dioxide, but even reduced the ratio of polishing rate instead.

Disclosed is a polishing solution formula of cerium oxide CMP, which uses polyether amine D series (such as polyether amine D230 or polyether amine D400) as an additive to improve the polishing rate of silicon dioxide by negatively charged cerium oxide. However, other polyether amines, such as polyether amine series T403 (x=1-2, y=1-2, z=1-2), M600 (x=1-2, y=9-11), ED900 (x=1-5, y=12.5, z=1-5), ED2003 (y=39, x=1-5, z=1-5) do not have the function of increasing the polishing rate of silicon dioxide. As seen from Table 3, embodiment 3B (polyether amine T403), embodiment 3C (polyether amine ED2003), embodiment 3D (polyether amine ED600), embodiment 3E (polyether amine ED900) and embodiment 3F (polyether amine M600) have negative values when compared with the polishing rate of silicon dioxide of embodiment 3A. In other words, the polishing rate of silicon dioxide is reduced.

According to the experimental results of the above embodiments 1-3, the chemical mechanical polishing solution containing polyether amine D230 or polyether amine D400 in this application can improve the polishing rate of silicon dioxide by negatively charged cerium oxide.

Although the above specific embodiments of the present invention have been described in detail, they are only examples, and the present disclosure is not limited to the embodiments described above. For those skilled in the art, any equivalent modification and substitution to the present invention is also covered in the present invention. Therefore, all these equivalent changes and modifications made without departing from the spirit and scope of the invention should be covered within the scope of the present invention.

The invention claimed is:

1. A chemical mechanical polishing solution, consisting of cerium oxide, a polyacrylic acid, a polyether amine, water, and a pH regulator, wherein said polyether amine is:

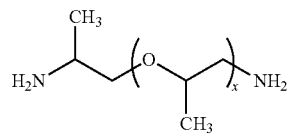

wherein X is 3-68;
wherein a molecular weight of said polyether amine is 230-4,000;
wherein a content of said polyether amine is 1-400 ppm;
wherein a content of said polyacrylic acid is 400-1,500 ppm; and
wherein a pH of the chemical mechanical polishing solution ranges from 4 to 5.

2. The chemical mechanical polishing solution according to claim 1, wherein the molecular weight of said polyether amine is 230-400.

3. The chemical mechanical polishing solution according to claim 1, wherein said polyether amine is:
X is 3-6.

4. The chemical mechanical polishing solution according to claim 1, wherein a content of said cerium oxide is 0.1-1.5 wt %.

5. The chemical mechanical polishing solution according to claim 1, wherein a molecular weight of said polyacrylic acid is 4,500-5,000.

6. The chemical mechanical polishing solution according to claim 1, wherein said pH regulator is selected from ammonia water, potassium hydroxide, nitric acid, acetic acid, hydrochloric acid, and sulfuric acid.

7. The chemical mechanical polishing solution according to claim 1, wherein the content of said polyacrylic acid is 530 ppm.

* * * * *